(12) United States Patent
Kates (10) Patent No.: US 6,980,665 B2
(45) Date of Patent: Dec. 27, 2005

(54) SPECTRAL ENHANCEMENT USING DIGITAL FREQUENCY WARPING

(75) Inventor: James M. Kates, Niwot, CO (US)

(73) Assignee: GN Resound A/S (DK)

( * ) Notice: Subject to any disclaimer, the term of this patent is extended or adjusted under 35 U.S.C. 154(b) by 171 days.

(21) Appl. No.: 10/087,090

(22) Filed: Mar. 1, 2002

(65) Prior Publication Data
US 2003/0072464 A1 Apr. 17, 2003

Related U.S. Application Data (63) Continuation-in-part of application No. 10/008,268, filed on Nov. 13, 2001.
(60) Provisional application No. 60/310,871, filed on Aug. 8, 2001.

(51) Int. Cl.$^7$ .............................................. H04R 25/00
(52) U.S. Cl. .................... 381/312; 381/316; 381/320
(58) Field of Search ................................ 381/312–321, 381/328, 380, 381, 151, 60; 600/25, 559; 607/55–57, 136–137

(56) References Cited

U.S. PATENT DOCUMENTS

| | | | |
|---|---|---|---|
| 4,689,818 A | 8/1987 | Ammitzboll | 381/68 |
| 4,731,850 A | 3/1988 | Levitt et al. | 381/68.2 |
| 5,016,280 A | 5/1991 | Engebretson et al. | 381/68 |
| 5,019,952 A | 5/1991 | Smolenski et al. | 363/16 |
| 5,091,952 A | 2/1992 | Williamson et al. | 381/68.2 |
| 5,259,033 A | 11/1993 | Goodings et al. | 381/68 |
| 5,402,496 A | 3/1995 | Soli et al. | 381/94 |
| 5,448,010 A | 9/1995 | Smith, III | 84/622 |
| 5,698,807 A * | 12/1997 | Massie et al. | 84/661 |
| 5,771,299 A | 6/1998 | Melanson | 381/68.2 |
| 5,940,519 A | 8/1999 | Kuo | 381/71.11 |
| 6,072,884 A | 6/2000 | Kates | 381/318 |
| 6,104,822 A | 8/2000 | Melanson et al. | 381/320 |
| 6,236,731 B1 | 5/2001 | Brennan et al. | 381/316 |

OTHER PUBLICATIONS

A. Harma, et al. "Frequency–Warped Signal Processing for Audio Applications", J. Audio Eng. Soc., vol. 48, No. 11, Nov. 2000, pp. 1011–1031.

* cited by examiner

Primary Examiner—Suhan Ni
(74) Attorney, Agent, or Firm—Michael J. Bolan; Bingham McCutchen LLP (57) ABSTRACT

A frequency-warped processing system using either sample-by-sample or block processing is provided. Such a system can be used, for example, in a hearing aid to increase the dynamic-range contrast in the speech spectrum, thus improving ease of listening and possibly speech intelligibility. The processing system is comprised of a cascade of all-pass filters that provide the frequency warping. The power spectrum is computed from the warped sequence and then compression gains are computed from the warped power spectrum for the auditory analysis bands. Spectral enhancement gains are also computed in the warped sequence allowing a net compression-plus-enhancement gain function to be produced. The speech segment is convolved with the enhancement filter in the warped time-domain to give the processed output signal. Processing artifacts are reduced since the frequency-warped system has no temporal aliasing.

53 Claims, 7 Drawing Sheets

SPECTRAL ENHANCEMENT USING DIGITAL FREQUENCY WARPING

CROSS-REFERENCES TO RELATED APPLICATIONS

This application claims benefit from U.S. Provisional Patent Application Ser. No. 60/310,871, filed Aug. 8, 2001, and is a continuation-in-part application of U.S. patent application Ser. No. 10/008,268, filed Nov. 13, 2001.

FIELD OF THE INVENTION

The present invention relates generally to audio systems and, more particularly, to a method and apparatus for spectral enhancement.

BACKGROUND OF THE INVENTION

A hearing impaired person typically suffers from a loss of hearing sensitivity, this loss dependent upon both the frequency and the audible level of the sound in question. Thus a hearing impaired person may be able to hear certain frequencies (e.g., low frequencies) as well as a non-hearing impaired person, but unable to hear sounds with the same sensitivity as the non-hearing impaired person at other frequencies (e.g., high frequencies). Similarly, the hearing impaired person may be able to hear loud sounds as well as the non-hearing impaired person, but unable to hear soft sounds with the same sensitivity as the non-hearing impaired person. Thus, in the latter situation, the hearing impaired person suffers from a loss of dynamic range.

A variety of analog and digital hearing aids have been designed to mitigate the above-identified hearing deficiencies. For example, spectral enhancement techniques increase the dynamic range contrast in the speech spectrum. The objective of spectral enhancement is to improve the ease of listening and possibly the level of speech intelligibility. With respect to dynamic range loss, typically a compressor is used to compress the dynamic range of the input sound so that it more closely matches the dynamic range of the intended user. The ratio of the input dynamic range to the dynamic range output by the compressor is referred to as the compression ratio. Generally the compression ratio required by a user is not constant over the entire input power range.

SUMMARY OF THE INVENTION

A frequency-warped processing system using either sample-by-sample or block processing is provided. Such a system can be used, for example, in a hearing aid to provide spectral enhancement by modifying the spectrum of the speech signal, thus improving speech intelligibility and perceived speech quality. The processing system is comprised of a cascade of all-pass filters that provide the frequency warping. The power spectrum is computed from the warped sequence and then compression gains are computed from the warped power spectrum for the auditory analysis bands. Spectral enhancement gains are also computed in the warped sequence allowing a net compression-plus-enhancement gain function to be produced. The gain versus frequency function is a set of pure real numbers, so the inverse frequency domain transform gives a set of time-domain filter coefficients. The speech segment is convolved with the enhancement filter in the warped time-domain to give the processed output signal. Processing artifacts are reduced since the frequency-warped system has no temporal aliasing.

Thus, in one aspect, the invention is an audio processing system such as used in a hearing aid, the audio processing system comprised of a plurality of cascaded all-pass filters, frequency domain transform applying means, means for calculating a plurality of frequency domain level estimates and a plurality of frequency domain gain coefficients, means for calculating a plurality of spectral enhancement gain coefficients, means for calculating a plurality of compression-spectral enhancement gain coefficients, means for applying an inverse frequency domain transform, and convolving means. Preferably the audio processing system is also comprised of an input transducer, an analog-to-digital converter, a digital-to-analog converter, and an output transducer. The spectral enhancement gain coefficients can be generated using a variety of algorithms. In a preferred embodiment, the spectral enhancement algorithm raises the signal spectrum to a power greater than 1. In another preferred embodiment, the spectral enhancement algorithm amplifies the peaks of the signal spectrum. In yet another preferred embodiment, the spectral enhancement algorithm consists of computing the input power spectrum, forming the unsmeared version of the spectrum, and using the difference between the original and the unsmeared spectra to give the enhancement gain.

In another aspect, the invention is an audio processing system such as used in a hearing aid, the audio processing system comprised of an input data buffer, a plurality of cascaded all-pass filters, means for windowing a first and second portion of a sequence of delayed samples, frequency domain transform applying means, means for calculating a first and second plurality of frequency domain level estimates, means for calculating a first and second plurality of spectral enhancement gain coefficients, summing means, normalizing means, means for calculating a plurality of frequency domain gain coefficients, means for calculating a plurality of compression-spectral enhancement gain coefficients, means for applying an inverse frequency domain transform, and convolving means. Preferably the audio processing system is also comprised of an input transducer, an analog-to-digital converter, a digital-to-analog converter, and an output transducer. The spectral enhancement gain coefficients can be generated using a variety of algorithms. In a preferred embodiment, the spectral enhancement algorithm raises the signal spectrum to a power greater than 1. In another preferred embodiment, the spectral enhancement algorithm amplifies the peaks of the signal spectrum. In yet another preferred embodiment, the spectral enhancement algorithm consists of computing the input power spectrum, forming the unsmeared version of the spectrum, and using the difference between the original and the unsmeared spectra to give the enhancement gain.

In yet another aspect, the invention is an audio processing system such as used in a hearing aid, the audio processing system comprised of an input data buffer for holding a block of data of size M, 2M cascaded all-pass filters, means for windowing a portion of a sequence of delayed samples of size M, 2M-point frequency domain transform applying means, means for calculating a plurality of frequency domain level estimates and frequency domain gain coefficients, means for calculating a plurality of spectral enhancement gain coefficients, means for calculating a plurality of compression-spectral enhancement gain coefficients, means for applying an inverse frequency domain transform, and convolving means. Preferably the audio processing system is also comprised of an input transducer, an analog-to-digital converter, a digital-to-analog converter, and an output transducer. The spectral enhancement gain coefficients can be generated using a variety of algorithms. In a preferred embodiment, the spectral enhancement algorithm raises the power spectrum to a power greater than 1. In another preferred embodiment, the spectral enhancement algorithm amplifies the peaks of the signal spectrum. In yet another preferred embodiment, the spectral enhancement algorithm consists of computing the input power spectrum, forming the unsmeared version of the spectrum, and using the difference between the original and the unsmeared spectra to give the enhancement gain.

In yet another aspect, the invention is a method of processing sound, such as used in a hearing aid, the method comprising the steps of receiving and converting analog input signals to digital input signals, passing digital input signals through a plurality of cascaded all-pass filters, forming a warped sequence of delayed samples, calculating a spectrum of the signal and forming from the spectrum a plurality of frequency domain level estimates and a plurality of frequency domain gain coefficients, calculating a plurality of spectral enhancement gain coefficients, forming a set of compression-spectral enhancement gain coefficients, convolving a sequence of delayed samples with the set of compression-spectral enhancement gain coefficients to form a digital output signal, converting the digital output signal to an analog output signal, and converting the analog output signal to an audio signal. The step of calculating a plurality of spectral enhancement gain coefficients can use any of a variety of different algorithms. In a preferred embodiment, the spectral enhancement algorithm raises the signal spectrum to a power greater than 1. In another preferred embodiment, the spectral enhancement algorithm amplifies the peaks of the signal spectrum. In yet another preferred embodiment, the spectral enhancement algorithm consists of computing the input power spectrum, forming the unsmeared version of the spectrum, and using the difference between the original and the unsmeared spectra to give the enhancement gain.

In yet another aspect, the invention is a method of processing sound, such as used in a hearing aid, the method comprising the steps of receiving and converting analog input signals to digital input signals, passing digital input signals through a data buffer and through a plurality of cascaded all-pass filters, windowing a first and second portion of a first sequence of delayed samples, forming a first and second warped sequence of delayed samples, calculating a first and second plurality of frequency domain level estimates, calculating a first and second plurality of spectral enhancement gain coefficients, summing and normalizing the first and second plurality of frequency domain level estimates, calculating a plurality of frequency domain gain coefficients, calculating a plurality of compression-spectral enhancement gain coefficients, forming a set of time-domain filter coefficients, convolving a second sequence of delayed samples with the set of time-domain filter coefficients to form a digital output signal, converting the digital output signal to an analog output signal, and converting the analog output signal to an audio signal. The step of calculating a plurality of spectral enhancement gain coefficients can use any of a variety of different algorithms. In a preferred embodiment, the spectral enhancement algorithm raises the signal spectrum to a power greater than 1. In another preferred embodiment, the spectral enhancement algorithm amplifies the peaks of the signal spectrum. In yet another preferred embodiment, the spectral enhancement algorithm consists of computing the input power spectrum, forming the unsmeared version of the spectrum, and using the difference between the original and the unsmeared spectra to give the enhancement gain.

In yet another aspect, the invention is a method of processing sound, such as used in a hearing aid, the method comprising the steps of receiving and converting analog input signals to digital input signals, passing digital input signals through a data buffer and a plurality of cascaded all-pass filters wherein the data buffer holds a block of data of size M and there are 2M cascaded all-pass filters, windowing a portion of size M of the sequence of delayed samples, applying a 2M-point frequency domain transform on the windowed sequence of delayed samples, calculating a plurality of frequency domain level estimates and frequency domain gain coefficients, calculating a plurality of spectral enhancement gain coefficients, calculating a plurality of compression-spectral enhancement gain coefficients, convolving a second portion of size M of the sequence of delayed samples with the set of compression-spectral enhancement gain coefficients to form a digital output signal, converting the digital output signal to an analog output signal, and converting the analog output signal to an audio signal. The step of calculating a plurality of spectral enhancement gain coefficients can use any of a variety of different algorithms. In a preferred embodiment, the spectral enhancement algorithm raises the signal spectrum to a power greater than 1. In another preferred embodiment, the spectral enhancement algorithm amplifies the peaks of the signal spectrum. In yet another preferred embodiment, the spectral enhancement algorithm consists of computing the input power spectrum, forming the unsmeared version of the spectrum, and using the difference between the original and the unsmeared spectra to give the enhancement gain.

A further understanding of the nature and advantages of the present invention may be realized by reference to the remaining portions of the specification and the drawings.

DESCRIPTION OF THE SPECIFIC EMBODIMENTS

Figure 1:
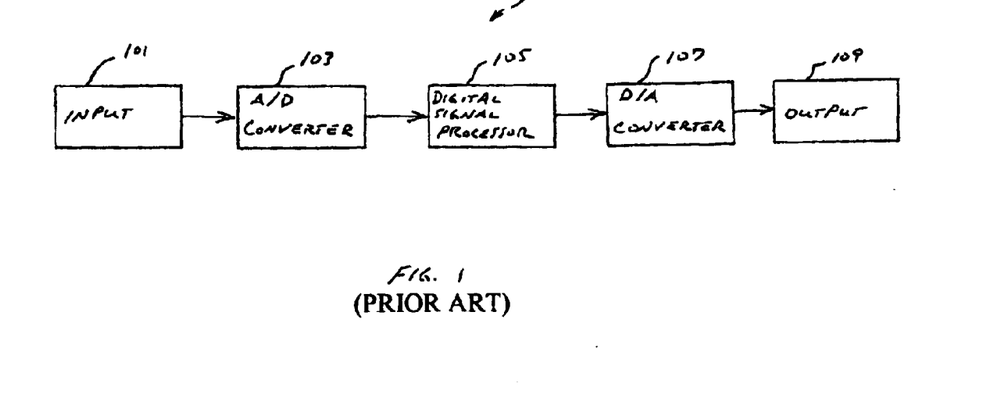
FIG. 1 is a simplified block diagram of a digital hearing aid.

FIG. 1 is a simplified block diagram of a digital hearing aid 100, used herein for exemplary purposes only. It is understood that the signal processing system of the present invention can also be used in other applications, such as audio systems, audio broadcasting, telephony, and the like. It should also be understood that hearing aid 100 can be an in-the-canal, in-the-ear, behind-the-ear, or otherwise mounted hearing aid. It should also be understood that depending upon the techniques employed within the digital signal processor, hearing aid 100 can represent either a prior art hearing aid or a hearing aid in accordance with the present invention.

Hearing aid 100 is comprised of an input transducer 101, preferably a microphone, an analog-to-digital (A/D) converter 103, a digital processing means 105 (e.g., a digital signal processor or DSP), a digital-to-analog (D/A) converter 107, and an output transducer 109, preferably a speaker. In operation, input transducer 101 receives audio signals and converts the audio signals into analog electrical signals. The analog electrical signals are converted by A/D converter 103 into digital electrical signals that are subsequently processed by DSP 105 to form a digital output signal. The digital output signal is converted by D/A converter 107 into an analog electrical signal. The analog signal is used by output transducer 109, e.g., a speaker, to produce an audio signal that is heard by the user of hearing aid 100.

Frequency Warping

The principles of digital frequency warping are known and therefore only a brief overview follows. Frequency warping is achieved by replacing the unit delays in a digital filter with first-order all-pass filters. The all-pass filters implement a bilinear conformal mapping that changes the frequency resolution at low frequencies with a complementary change in the frequency resolution at high frequencies.

The all-pass filter used for frequency warping is given by:

$$A(z) = \frac{z^{-1} - a}{1 - az^{-1}} \quad \text{(Eq. 1)}$$

where $\alpha$ is the warping parameter. For a real, setting $\alpha > 0$ increases the frequency resolution at low frequencies and setting $\alpha < 0$ increases the resolution at high frequencies. For the present application, preferably the selected value of $\alpha$ gives a frequency scale corresponding to the auditory frequency analysis. The optimal value for the warping parameter that gives the closest fit to the Bark frequency scale is given by:

$$\alpha = 0.8517[\tan^{-1}(0.06583 f_s)]^{1/2} - 0.916 \quad \text{(Eq. 2)}$$

where $f_s$ is the sampling rate in kHz. For a sampling rate of 16 kHz, the optimal value for $\alpha$ is 0.5756. The warped digital frequency scale is given by:

$$\Omega(\omega) = \tan^{-1}\left[\frac{(1 - a^2)\sin(\omega)}{(1 + a^2)\cos(\omega) + 2a}\right] \quad \text{(Eq. 3)}$$

A fast Fourier transform (FFT) algorithm in the unwarped frequency domain would produce values at uniformly spaced frequencies $\omega_k$ along the frequency axis $0 \leq \omega \leq 2\pi$. An FFT computed in the warped frequency domain would have samples at the frequencies $\Omega(\omega_k)$ given by the transformation of Eq. (3).

Figure 2:
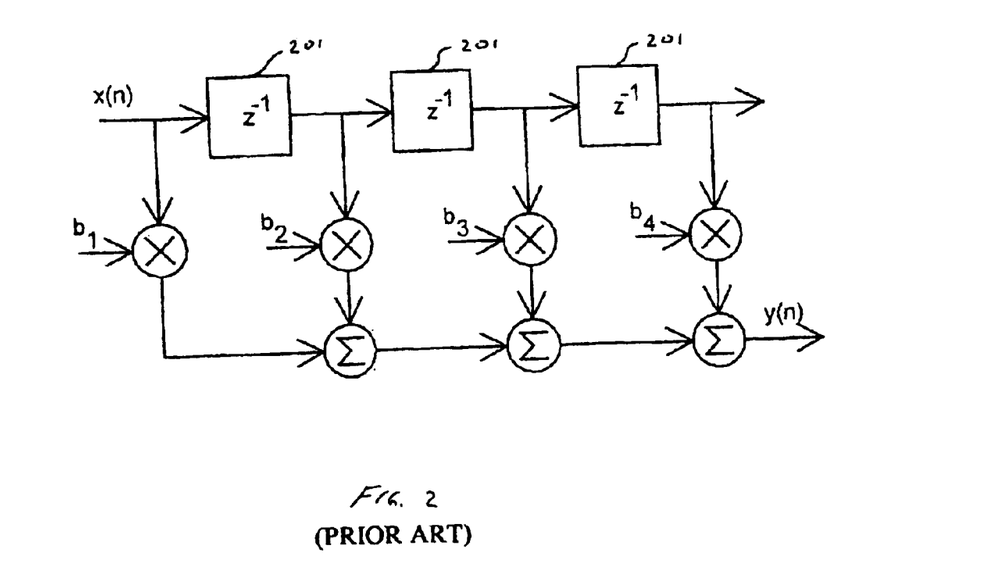
FIG. 2 illustrates a conventional FIR filter.
Figure 3:
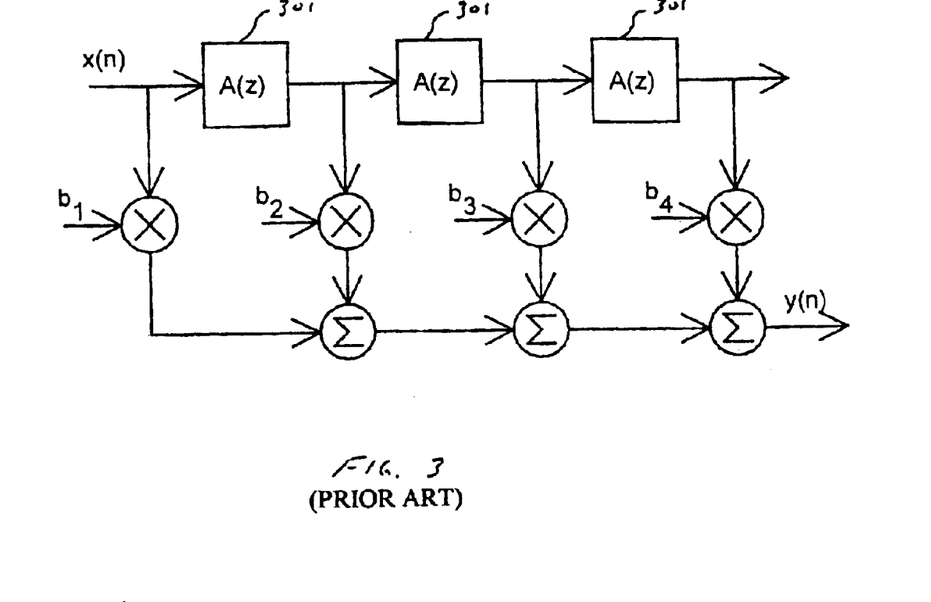
FIG. 3 illustrates a warped FIR filter.

A conventional finite impulse response (FIR) filter is shown in FIG. 2 and a warped FIR filter is shown in FIG. 3. The warped filter is constructed from the unwarped FIR filter by replacing the unit delays $z^{-1}$ (201) with the all-pass filters A(z) (301). The z-transform of the conventional FIR filter is given by:

$$B(z) = \sum_{k=0}^{K} b_k z^{-k} \quad \text{(Eq. 4)}$$

for a filter having K+1 taps. Assuming that the filter coefficients, $b_k$, have even symmetry gives $b_k = b_{K-k}$. For K odd, the filter has an even number of taps and the z-transform can be rewritten as:

$$B(z) = \sum_{k=0}^{(K-1)/2} b_k [z^{-k} + z^{-(K-k)}] \quad \text{(Eq. 5)}$$

Rearranging the delay terms leads to:

$$B(z) = \sum_{k=0}^{(K-1)/2} b_k z^{-K/2} [z^{-(k-K/2)} + z^{(k-K/2)}]$$

$$= z^{-K/2} \sum_{k=0}^{(K-1)/2} b_k [z^{-(k-K/2)} + z^{(k-K/2)}] \quad \text{(Eq. 6)}$$

Evaluating the z-transform on the unit circle gives:

$$B(e^{j\omega}) = e^{-j\omega K/2} \sum_{k=0}^{(K-1)/2} 2 b_k \cos[\omega(k - K/2)] \quad \text{(Eq. 7)}$$

The term outside the summation represents a fixed delay. The term inside the summation is pure real and is therefore zero-phase and does not contribute to the filter delay. The symmetric FIR filter is therefore a linear phase filter with a constant filter delay that does not depend on the actual filter coefficients as long as the symmetry is maintained. If the conventional (i.e., unwarped) FIR filter has K+1 taps, then the delay is K/2 samples.

The analysis for the symmetric warped FIR filter proceeds along the same lines as for the conventional FIR filter. The filter delay will again be evaluated for a symmetric filter having an even number of taps. (Note that the analysis for an odd number of taps is similar). The z-transform of a warped FIR filter is given by:

$$\tilde{B}(z) = \sum_{k=0}^{K} b_k A^k(z) \quad \text{(Eq. 8)}$$

where A(z) is the all-pass filter given by Eq. (1). Assuming again that the filter coefficients have an even symmetry yields $b_k = b_{K-k}$. For K odd, the filter has an even number of taps and the z-transform can be rewritten as:

$$\tilde{B}(z) = \sum_{k=0}^{(K-1)/2} b_k [A^k(z) + A^{(K-k)}z] \quad \text{(Eq. 9)}$$

Rearranging the delay terms leads to:

$$\tilde{B}(z) = \sum_{k=0}^{(K-1)/2} b_k A^{K/2}(z)[A^{(k-K/2)}(z) + A^{-(k-K/2)}(z)]$$

$$= A^{K/2}(z) \sum_{k=0}^{(K-1)/2} b_k [A^{(k-K/2)}(z) + A^{-(k-K/2)}(z)] \quad \text{(Eq. 10)}$$

The filter delay is determined by evaluating Eq. (10) on the unit circle. Note that $A_{-1}(e^{j\omega}) = A^*(e^{j\omega})$ where the asterisk "*" denotes the complex conjugate. Thus the term outside the summation in Eq. (10) represents a fixed frequency-dependent group delay and the term inside the summation is again pure real and does not contribute to the filter group delay. The symmetric warped FIR filter thus has a fixed frequency-dependent group delay that does not depend on the actual filter coefficients as long as the symmetry is maintained. If the warped FIR filter has K+1 taps, then the group delay is K/2 times the group delay of a single all-pass filter.

Figure 4:
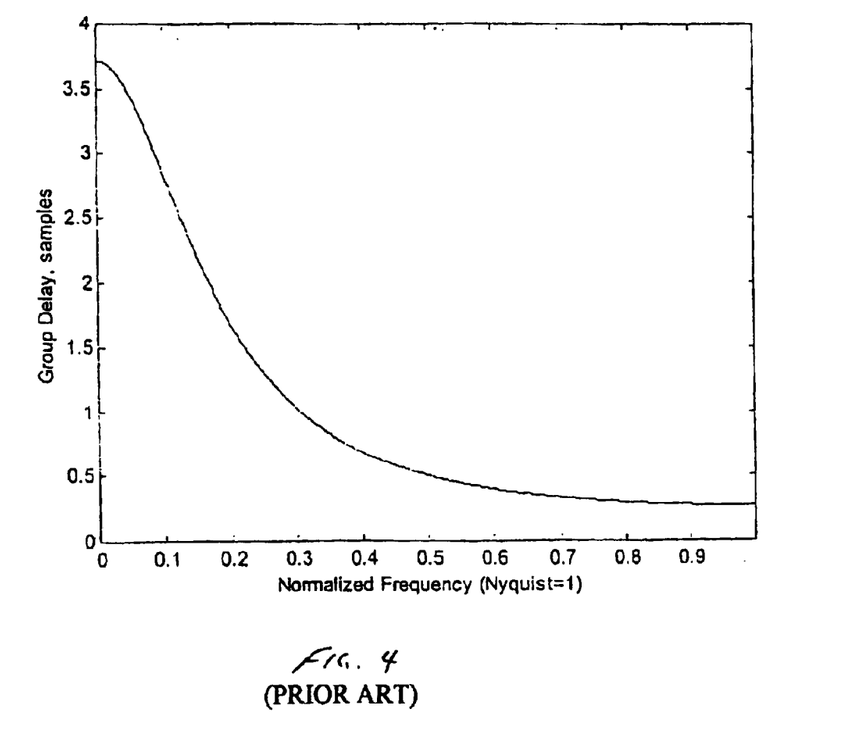
FIG. 4 illustrates the group delay for a single first-order all-pass filter section having $\alpha=0.5756$.

The group delay for an all-pass filter used for frequency warping is shown in FIG. 4, assuming a 16-kHz sampling rate and the associated optimal all-pass filter parameter for the Bark frequency scale. The group delay for one all-pass section ranges from 3.71 samples at 0 Hz to 0.27 samples at 8 kHz, and is 1 sample at 2.44 kHz. Thus for frequencies below 2.44 kHz, the symmetric warped system has a greater delay than the symmetric conventional FIR having the same number of taps, and the warped system has a shorter delay above 2.44 kHz. The overall group delay for a 15-tap (i.e., K=14) symmetric warped FIR filter would be seven times the values for a single all-pass stage, giving a delay ranging from 26 samples at 0 Hz to 1.9 samples at 8 kHz. For a 31-tap (i.e., K=30) symmetric warped FIR filter, the delay would range from 115 samples at 0 Hz to 8.4 samples at 8 kHz.

Figure 5:
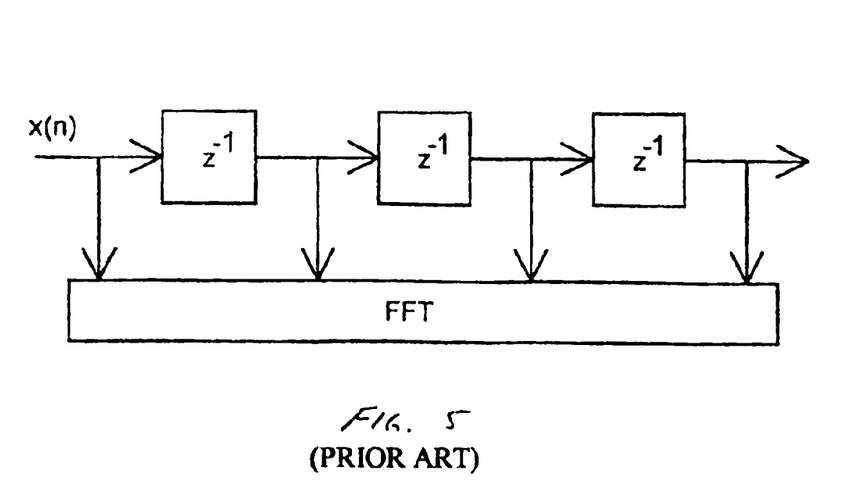
FIG. 5 illustrates a conventional FFT.
Figure 6:
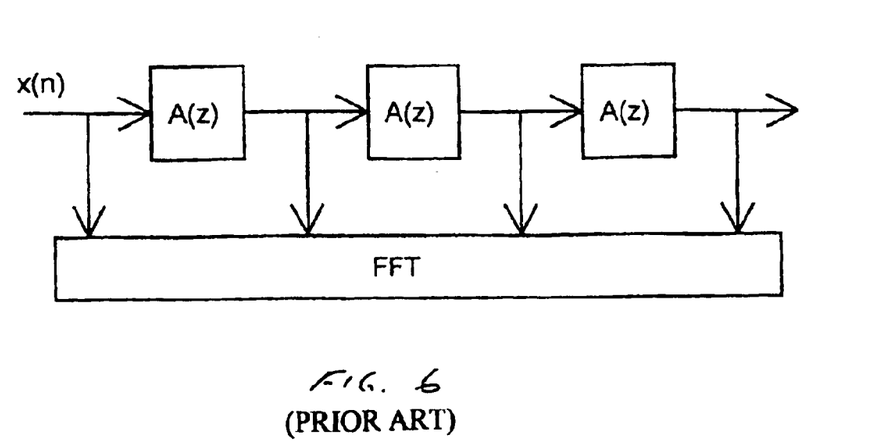
FIG. 6 illustrates a warped FFT.

The FFT can also be computed in the warped frequency domain, as shown in FIGS. 5 and 6. In the conventional FFT of FIG. 5, the FFT is computed using the contents of a buffer containing the present and past samples of the signal being analyzed. For the warped FFT shown in FIG. 6, the unit delays implicit in filling the data buffer are replaced with all-pass filters. The properties of a warped FFT parallel those of the unwarped FFT. Windowing the contents of the all-pass filtered data buffer, for example, reduces the warped FFT sidelobe level. Windowing the data in the buffer is equivalent to smoothing the FFT in the warped frequency domain. Using a hanning (von Hann) window, for example, is equivalent to a three-point frequency-domain smoothing function in which each FFT bin is combined with its neighbor to either side. This property still holds in the warped frequency domain, but because the FFT bin frequency spacing has been warped, the frequency extent of the smoothing has also been warped by an equivalent amount. Thus the frequency smoothing for the warped FFT is by a constant amount on the Bark frequency scale.

Warped Spectral Enhancement System

Figure 7:
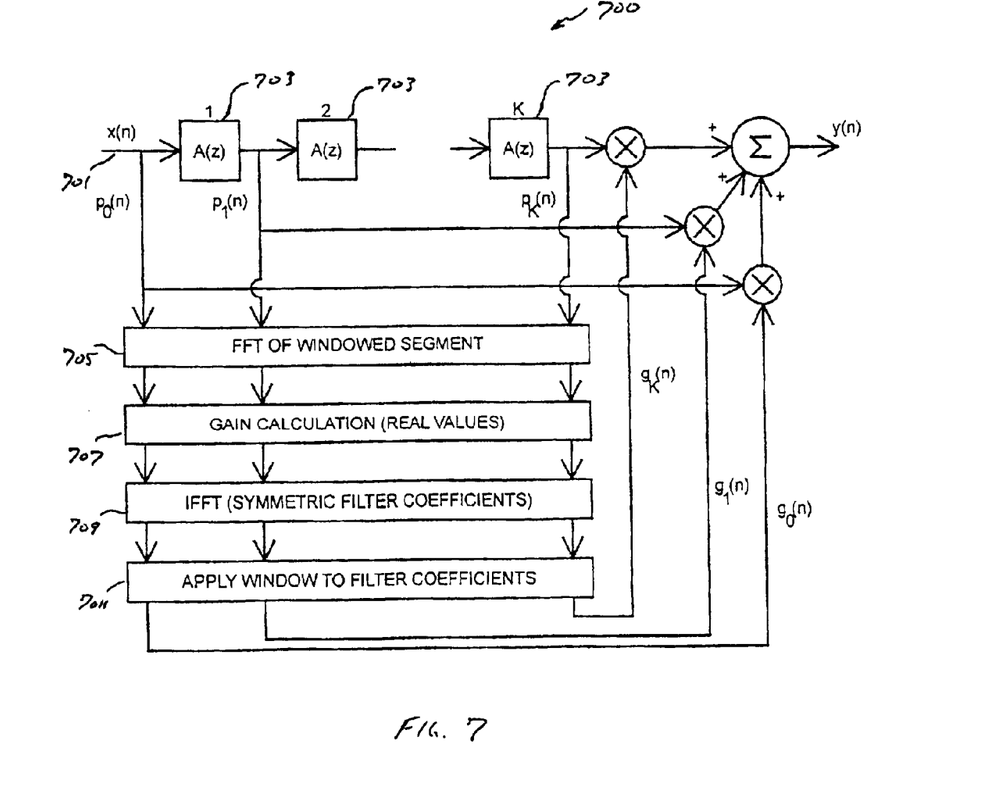
FIG. 7 illustrates a compressor that uses a warped frequency scale for both the frequency analysis and the filtered signal synthesis.
Figure 8:
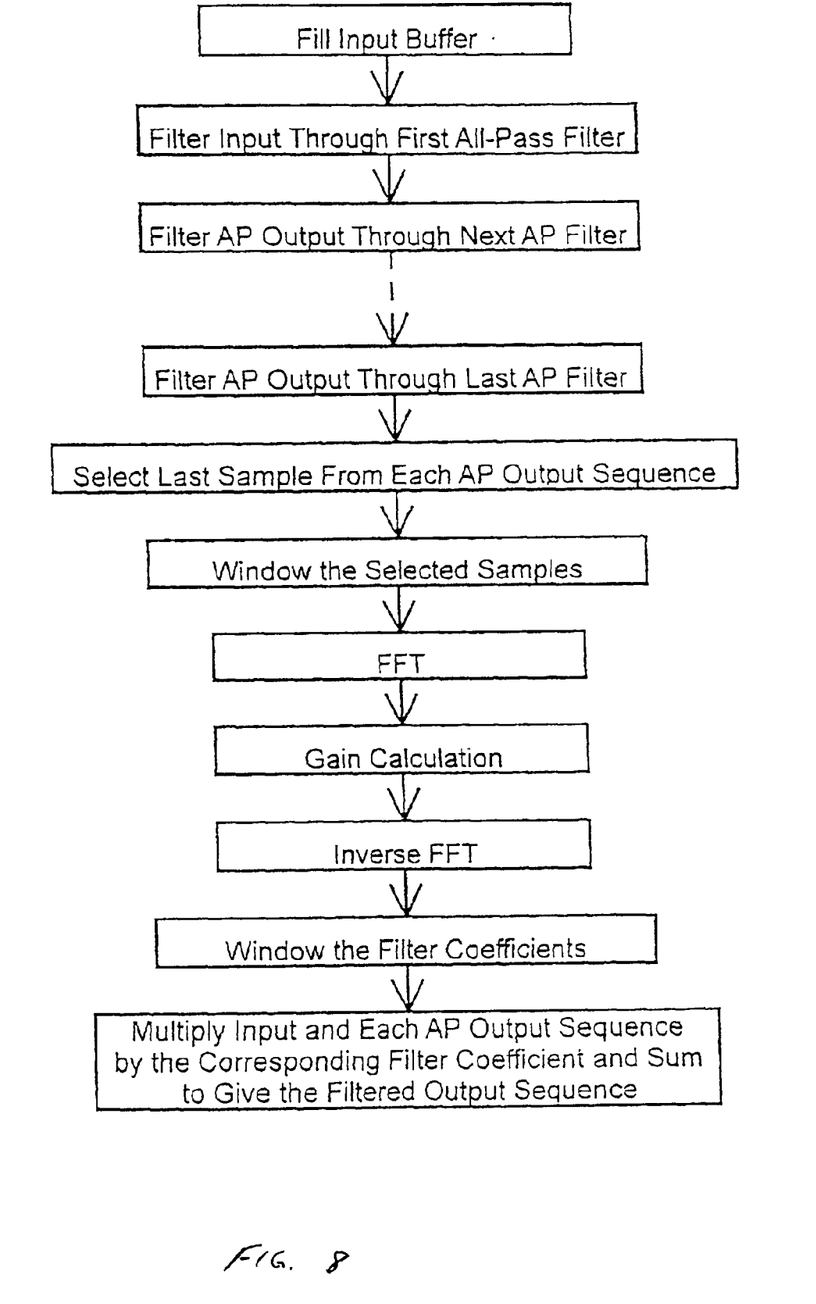
FIG. 8 illustrates the use of block time-domain processing in the warped compression system of the present invention.

A block diagram of a frequency-warped processing system according to the invention is shown in FIG. 7, the processing system being applicable to the digital processing means of an audio system such as the hearing aid shown in FIG. 1. FIG. 7 shows a sample-by-sample processing implementation although the invention can also be applied to a block processing implementation as illustrated in FIG. 8. System 700 combines a warped FIR filter with frequency analysis provided by a warped FFT. The same tapped delay line is used for both the frequency analysis and the FIR compression filter. The incoming signal x(n) (701) is passed through a cascade of first-order all-pass filters 703 of the form given by Eq. (1). The output of the $k^{th}$ all-pass stage is given by:

$$p_0(n) = x(n)$$

$$p_k(n) = \alpha[p_k(n-1) - p_{k-1}(n)] + p_{k-1}(n-1), \ 1 \leq k \leq K \quad \text{(Eq.11)}$$

The sequence of delayed samples $\{p_k(n)\}$ is then windowed and a FFT calculated using the windowed sequence (705).

The result of the FFT is a spectrum sampled at a constant spacing on a Bark frequency scale. Since the data sequence is windowed, the spectrum is smoothed in the warped frequency domain thereby giving overlapping frequency bands. The frequency domain level estimates (e.g., power spectrum) is computed from the warped FFT and the frequency domain gain coefficients (e.g., compression gains) then computed from the warped power spectrum for the auditory analysis bands (707). The spectral enhancement gains are also computed from the warped FFT and a net compression-plus-enhancement gain function is produced. As the gain versus frequency function is a set of pure real numbers, the inverse FFT of the warped time-domain filter results in a set of filter coefficients that is real and has even symmetry (709). The time-domain filter coefficients are then windowed to reduce ripple in the compressor output when the system is excited by a swept sinusoid. The system output is then calculated by convolving the delayed samples with the compression gain filter (711):

$$y(n) = \sum_{k=0}^{K} g_k(n) p_k(n) \quad \text{(Eq. 12)}$$

where $\{g_k(n)\}$ are the compression filter coefficients.

In comparison with a conventional FIR system having the same FIR filter length, the warped spectral enhancement system will require more computational resources because of the all-pass filters in the tapped delay line. However, in many cases the warped FIR filter will be shorter than the conventional FIR filter needed to achieve the same degree of frequency resolution. For example, a nine-band compressor requires a 31-tap conventional FIR filter but can be realized with a 15-tap warped FIR filter.

As previously noted, the warped spectral enhancement system of the present invention can also be implemented using block time-domain processing as shown in FIG. 8 instead of the sample-by-sample processing shown in FIG. 7.

For an input data buffer containing M samples, for example where M equals 16, one approach is to have M delay stages in the tapped delay line and to use a FFT of length M for the warped frequency analysis. A sliding window is used to give a 50-percent overlap of the FFT power spectra. The overlap is provided by processing M/2 samples through the delay line, windowing the data, and computing an M-point FFT. The remaining M/2 samples are then processed through the delay line and a second windowed M-point FFT computed. Power spectra are computed from the two FFTs and then summed and normalized to give the power spectrum used for the compression gain calculation. The output sequence y(n) is computed as the input data is sent through the tapped delay line using the gains calculated from the previous data block.

A second approach is to have M samples in the input data buffer but 2M stages in the tapped delay line and to use an FFT of length 2M for the warped frequency analysis. Half the contents of the delay line relate to the previous M-sample block of data and half relate to the incoming block of data. The sliding window for the 50-percent data overlap is realized by computing a windowed 2M-point FFT every M samples. The power spectrum computed from the 2M-point FFT is used for the compression gain calculation and again the output sequence y(n) is computed as the input data is sent through the tapped delay line using the gains calculated from the previous data block.

In at least one embodiment of the invention, the processing system is a warped FIR side-branch system consisting of a 16-sample data buffer and a 32-point warped FFT used in conjunction with a 31-tap warped FIR filter. The input data segment, after passing through the all-pass stages that provide the frequency warping, is windowed with a 32-point hanning (von Hann) window and no frequency-domain smoothing is applied to the spectrum. The sliding window for the 50-percent data overlap is realized by computing a windowed 32-point FFT every 16 input samples. The enhancement gains are computed in the warped frequency domain, transformed into the warped time-domain, and then smoothed by applying a 31-point hanning (von Hann) window to the enhancement filter coefficients. The speech segment is then convolved with the enhancement filter in the warped time-domain to give the processed output. The center frequencies of the 17 analysis bands are shown in Table I below.

TABLE I

Band center frequencies in Hz for a Warp-31 compression system.

| Band Number | Warp-31 Center Frequency | Band Number | Warp-31 Center Frequency |
|---|---|---|---|
| 1 | 0 | | |
| 2 | 135 | 10 | 1615 |
| 3 | 273 | 11 | 1952 |
| 4 | 415 | 12 | 2378 |
| 5 | 566 | 13 | 2937 |
| 6 | 728 | 14 | 3698 |
| 7 | 907 | 15 | 4761 |
| 8 | 1108 | 16 | 6215 |
| 9 | 1340 | 17 | 8000 |

A major advantage of the spectral enhancement structure described above is the absence of temporal aliasing. In the FFT compressor, the compression and spectral enhancement gains are computed and applied to the input signal in the frequency domain. There is no test to ascertain that the length of the signal segment, after being convolved with the filter, is less than the inverse FFT segment length. Accordingly, if the convolved signal length is too long, temporal aliasing will occur; the end of the convolved signal wraps around to the beginning of the processed segment and overlaps the initial portion of the signal. The spectral smoothing applied to the compression gains in the frequency domain reduces, but does not eliminate, temporal aliasing. Spectral enhancement, however, undoes the spectral smoothing, thus causing an increase in temporal aliasing in a system combining compression with spectral enhancement. The result of the increased temporal aliasing is increased processing artifacts such as audible "gurgling" when processing a noise signal. However, in the side-branch structure, the FFT is used only for the frequency analysis and the inverse FFT is used only to produce the gain function. As the signal is convolved with the gains in the time-domain, temporal aliasing, which results from problems in the frequency-domain convolution, cannot occur.

Warped Spectral Enhancement Algorithms

As will be understood by those of skill in the art, the present invention can use a variety of different algorithms. Three exemplary spectral enhancement algorithms are presented below. All of the algorithms estimate the signal spectrum by using the peak detectors implemented for the compression system, thus minimizing the processing burden in a real-time implementation. The power in each frequency band (warped FFT bin) was detected using a 5 millisecond attack time and a 70 millisecond release time. The peak-detected power spectrum was then used as the input for determining the spectral enhancement gain as a function of frequency. Because the Warp-31 system has only 17 frequency bands, the spectral enhancement can only apply to the general spectral shape and not to the details of the spectrum. For example, spectral enhancement systems that try to suppress the noise found between the spectral lines of voiced speech cannot be implemented with this limited number of frequency bands. It is, however, possible to modify the general spectral shape in response to the short-time peak-detected signal spectrum.

i) Spectrum Raised to a Power

In one embodiment, spectral enhancement is achieved by basically raising the signal spectrum to the power 1+M, where M>0. Let the power spectrum in dB be denoted by $$S(k)=10 \log_{10}[|P(k)|^2] \quad (13)$$

where P(k) is the frequency-warped power spectrum. The spectral enhancement filter, in dB, is then given by $$G(k)=M \times S(k) \quad (14)$$

where M is the scaling factor. The gains for each data block are then normalized to give 0 dB gain at the peak frequency and varying amounts of attenuation at the other frequencies. The gains are then processed through an inverse FFT to yield an even symmetric warped FIR filter.

A potential problem with raising the spectrum to a power is noise modulation. Any noise present in the signal will be attenuated by M times the difference in level between the noise and the signal peak. The greater the speech intensity, the greater the suppression of the noise. Thus noise will be suppressed by a large amount during vowels and by a small amount during consonants, giving rise to an audible noise modulation by the speech.

ii) Spectral Second Difference

The peaks of a spectrum tend to be more important than the valleys. Vowels, for example, are characterized by the first and second formants while consonants are characterized by the regions of maximum spectral power. Thus one approach to spectral enhancement is to amplify the peaks of the spectrum. In this new algorithm, the peaks are located by applying a second-difference operator to the power spectrum. A peak is located at FFT bin k if $S(k)>S(k-1)$ and $S(k)>S(k+1)$. A necessary condition for a peak is therefore that $D(k)>0$, where $D(k)=2S(k)-[S(k-1)+S(k+1)]$. The function D(k) is the negative of the second difference of the log spectrum. $D(k)>0$ indicates a spectral peak, $D(k)<0$ indicates a spectral valley, and $D(k)=0$ indicates a region of constant slope. The greater D(k), the sharper the spectral peak, and the more negative D(k), the sharper the spectral valley.

The new spectral enhancement scheme uses D(k) to indicate the amount of enhancement gain. The goal is to increase the gain in the vicinity of the peaks and to leave the gain unmodified in the valleys. The gain in dB is thus given by $$G(k) = \begin{cases} M \times D(k), & D(k) > 0 \\ 0, & D(k) \leq 0 \end{cases} \quad (15)$$

where M is the scaling factor. The gains for each data block are then normalized to give 0 dB gain at the frequency corresponding to the largest value of D(k) and varying amounts of attenuation at the other frequencies. The gains are then processed through an inverse FFT to yield an even symmetric warped FIR filter.

iii) Compensation for Upward Spread of Masking

One characteristic of impaired hearing is increased upward spread of masking in comparison with unimpaired hearing. A simple model for the increased upward spread of masking is to assume that a smearing function has been applied to the power spectrum, the smearing function forming a smoothed spectrum by combining power estimates across adjacent frequency bands. The compensation for the excess upward spread of masking is then the inverse of the smearing function.

Assume that the excess upward spread of masking can be approximated by an exponentially decaying weighting factor applied to the lower frequency warped FFT bins. That is, $|\hat{P}(k)|^2$ contains $\alpha|P(k-1)|^2 + \alpha^2|P(k-2)|^2 + \ldots + \alpha^{k-1}|P(1)|^2$. In matrix notation, the smeared spectrum can be expressed as $$|\hat{P}|^2 = A|P|^2 \quad (16)$$

where the smearing matrix A is given by $$A = \begin{bmatrix} 1 & 0 & 0 & 0 \\ \alpha & 1 & 0 & 0 \\ \alpha^2 & \alpha & 1 & 0 \\ \alpha^3 & \alpha^2 & \alpha & 1 \end{bmatrix} \quad (17)$$

for example, in a four-band system. The correction for the smearing is the inverse of the smearing matrix. In the four-band example, the correction matrix is given by $$A^{-1} = \begin{bmatrix} 1 & 0 & 0 & 0 \\ -\alpha & 1 & 0 & 0 \\ 0 & -\alpha & 1 & 0 \\ 0 & 0 & -\alpha & 1 \end{bmatrix} \quad (18)$$

The form of the correction matrix generalizes to any number of bands.

The spectral enhancement consists of computing the input power spectrum, forming the unsmeared version of the spectrum, and using the difference between the original and unsmeared spectra to give the enhancement gain. The unsmeared power spectrum is given by $$51 \quad \tilde{P}(k)|^2 = \text{Max}\{[|P(k)|^2 - M \times |P(k-1)|^2], \epsilon\} \quad (19)$$

where M is the enhancement factor corresponding to ax in Eq. (18), and $\epsilon$ is a small positive value so that negative spectral powers are avoided. This algorithm thus produces a one-sided version of the "Mexican Hat" or difference-of-Gaussians spectral filter used by Stone and Moore. The spectral enhancement gain in dB is then given by $$G(k) = 10 \log_{10}|\tilde{P}(k)|^2 - 10 \log_{10}|P(k)|^2 \quad (20)$$

The gains for each data block are then normalized to give 0 dB gain at the frequency corresponding to the largest value of G(k) and varying degrees of attenuation at the other frequencies. The gains are then processed through an inverse FFT to yield an even symmetric warped FIR filter.

In operation, the masking compensation attenuates or removes signal components that would otherwise be inaudible due to the upward spread of masking. The masked components are not amplified to lie above the masked threshold. Rather, the level of the masked components is reduced by the amount that the assumed masking effects exceed them. This form of processing is analogous to reducing the gain in assumed dead cochlear regions; if the signal cannot be accurately perceived, it is removed.

Spectral Enhancement Algorithm Similuations

The three exemplary spectral enhancement algorithms described above were simulated in MATLAB using the previously disclosed Warp-31 compressor structure. The sampling rate was 16 kHz. The processing approaches were compared using a portion from the Rainbow Passage recorded by a male talker, the Rainbow Passage being a well-known articulation exercise that includes all of the normal sounds of spoken English. The first second of the text is "When the sunlight s(trikes) . . . ". Two segments of the selected portion of speech were used to illustrate the enhancement processing effects. The first segment is the voiced speech located at 0.60 seconds into the selected portion of the speech. This segment corresponds to the beginning of the "i" in "light". The second segment is the unvoiced segment located at 0.85 seconds into the selected speech portion. This segment corresponds to the "s" at the beginning of "strikes".

Segment 1—Voiced Speech

Figure 9:
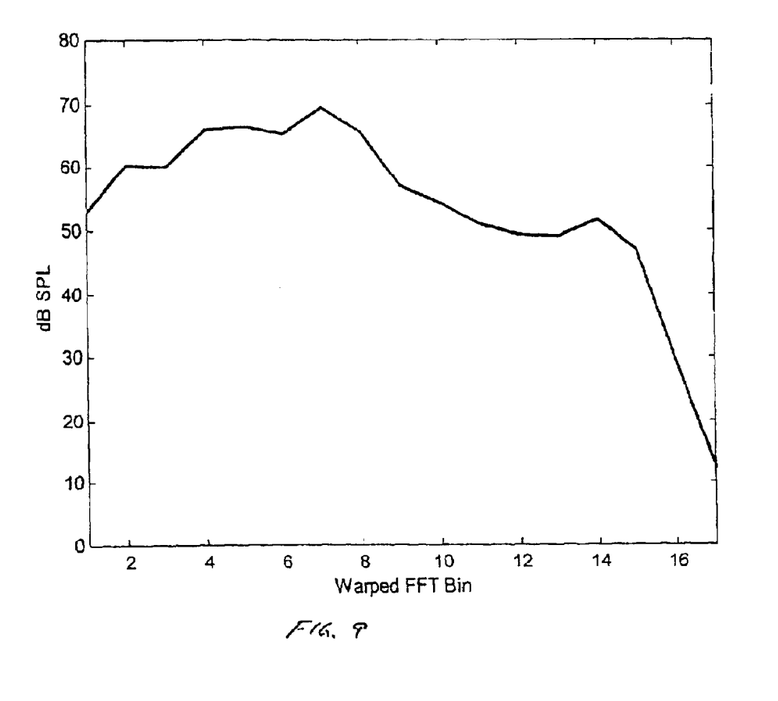
FIG. 9 illustrates the power spectrum for a voiced speech segment.
Figure 10:
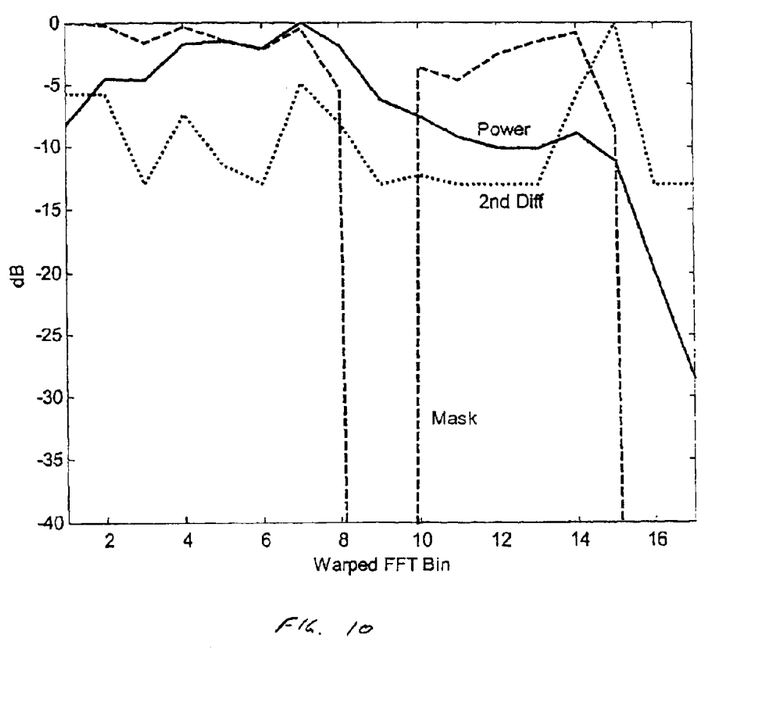
FIG. 10 illustrates the spectral enhancement gains before coefficient windowing for the vowel segment of FIG. 9.

The power spectrum for segment 1, the voiced speech segment, is presented in FIG. 9. The peak in the vicinity of bins 4 and 5 (415 and 566 Hz, respectively) corresponds to the first formant, the peak at bin 7 (907 Hz) to the second formant, and the peak at bin 14 (3698 Hz) to the third formant. The gains computed for the three speech-enhancement approaches described above are plotted in FIG. 10. Note that the vertical axis scale extent in FIG. 10 is half that used in FIG. 9. In FIG. 10, the enhancement gains for the raising the spectrum to a power (M=0.5) are shown by the solid line, the gains for using the second spectral difference (M=1) are shown by the dotted line, and the gains for masking compensation (M=0.3) are shown by the dashed line.

Raising the spectrum to the 0.5 power provides the maximum gain at the highest peak of the spectrum and attenuates all of the other frequency components. In this case the peak is at the second formant, so the first and third formats are attenuated. If the peak were at the first format, the second and third formants would be attenuated, which could potentially reduce speech intelligibility. The 17 warped FFT bins appear to provide adequate frequency resolution for duplicating the overall spectral shape in implementing the spectral enhancement.

The spectral second difference provides the maximum gain at the frequency bin where the spectrum has the greatest curvature. Since the curvature is computed from the log spectrum, the greatest value is actually just above the third formant peak because of the steep drop off in response above the third formant. In comparison with raising the spectrum to a power, using the second difference provides more emphasis on the peaks of the spectrum and more effectively suppresses the valleys between the peaks for this speech segment.

The masking compensation provides a relatively small amount of spectral enhancement. The formant peaks are all given about the same amount of gain because they are minimally masked by the lower frequencies in the spectrum. The third formant in this example, despite being at a low level, is far enough away from the second formant that the masking model predicts very little interference. The masking compensation, however, tries to remove spectral valley regions where the stronger adjacent signal frequencies would cause masking, and thus produces an enhancement function that has minimal effect below but produces a deep notch above each peak.

Segment 2—Unvoiced Speech

Figure 11:
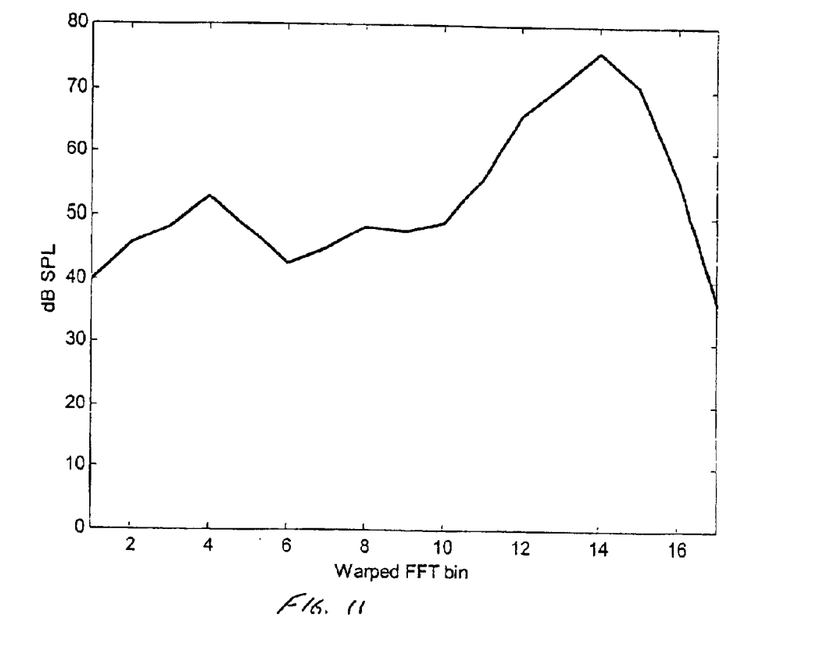
FIG. 11 illustrates the power spectrum for an unvoiced speech segment.
Figure 12:
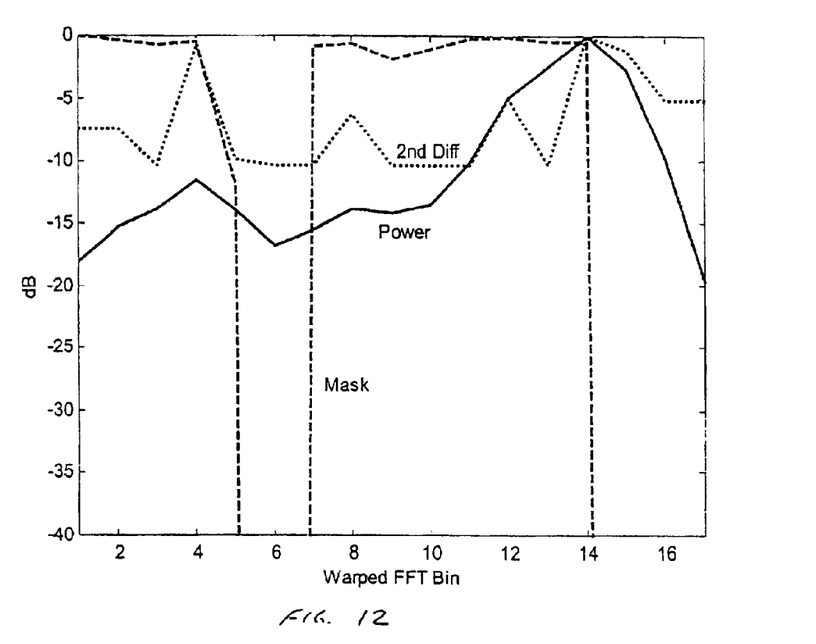
FIG. 12 illustrates the spectral enhancement gains before coefficient windowing for the consonant segment of FIG. 11.

The power spectrum for the unvoiced speech segment is presented in FIG. 11. The major peak is at bin 14 (3698 Hz) with a secondary peak at bin 4 (415 Hz). The gains computed for the three speech-enhancement approaches are plotted in FIG. 12. As noted above for segment 1, the vertical axis scale extent in FIG. 12 is half that used in FIG. 11. The enhancement gains for the raising the spectrum to a power (M=0.5) are shown by the solid line, the gains for using the second spectral difference (M=1) are shown by the dotted line, and the gains for masking compensation (M=0.3) are shown by the dashed line.

Raising the spectrum to the 0.5 power provides 0-dB gain at the high-frequency peak of the spectrum. All other spectral components are attenuated, with the greatest attenuation at low frequencies.

The spectral second difference provides 0-dB gain at the peak at bin 14 and provides nearly that amount at the secondary peak at bin 4. Even though the low-frequency peak is at a low intensity, the curvature of the log spectrum is large enough that the second difference gives a relatively high enhancement gain. Unlike the other enhancement schemes, the second difference provides relatively little attenuation at frequencies above the peak at bin 14.

The masking compensation provides nearly flat enhancement gain as a function of frequency except for two notches imposed on the spectrum. Each notch is at frequencies directly above a peak of the power spectrum. The notches are the result of the approximated masking function, indicating that the masking caused by the peaks exceeds the level of the signal that would be found in a normal ear at the same frequencies. The spectral enhancement therefore removes the original signal to make room for the masking effects in the average inner hair cell neural firing rate. The masking compensation removes all of the signal power above the peak at bin 14, thus eliminating half the power of the consonant.

In summary, the spectral enhancement examples provided above indicate that spectral enhancement is possible in a frequency-warped system. The use of a frequency-warped side-branch processing approach has two major advantages. First, temporal aliasing can never occur in the side-branch system, so processing artifacts due to spectral enhancement are greatly reduced in comparison with the FFT compressor system. Second, the frequency analysis used for the spectral enhancement is performed in the warped frequency domain, so auditory frequency resolution on the Bark scale is automatically incorporated into the enhancement gain calculation.

Accordingly, and as illustrated above, spectral enhancement is feasible in a frequency-warped system. However, as will be understood by those familiar with the art, the present invention may be embodied in other specific forms and utilize any of a variety of different algorithms without departing from the spirit or essential characteristics thereof. For example, the selection of an algorithm is typically application specific, the selection dependent upon a variety of factors including the expected processing complexity and computational load. Accordingly, the disclosures and descriptions herein are intended to be illustrative, but not limiting, of the scope of the invention which is set forth in the following claims.

What is claimed is:

1. A method of processing sound in a hearing aid, comprising the steps of:
    receiving acoustical signals within the hearing aid;
    transforming the acoustical signals into digital input signals;
    passing a portion of said digital input signals through a plurality of cascaded all-pass filters to form a sequence of delayed samples;
    windowing said sequence of delayed samples;
    applying a frequency domain transform to said windowed sequence of delayed samples to form a warped sequence;
    calculating a plurality of frequency domain level estimates from said warped sequence;
    calculating a plurality of frequency domain gain coefficients from said plurality of frequency domain level estimates to form a warped time-domain filter;
    calculating a plurality of spectral enhancement gain coefficients from said warped sequence;
    calculating a plurality of compression-spectral enhancement gain coefficients from said plurality of frequency domain gain coefficients and said plurality of spectral enhancement gain coefficients;
    applying an inverse frequency domain transform on said plurality of compression-spectral enhancement gain coefficients to form a set of time-domain filter coefficients; and
    convolving said sequence of delayed samples with said set of time-domain filter coefficients to produce a digital output signal.

2. The method of claim 1, wherein the hearing aid is configured to be mounted on the ear of a user.

3. The method of claim 1, wherein the hearing aid is an in-the-canal hearing aid.

4. The method of claim 1, wherein the hearing aid is an in-the-ear hearing aid.

5. The method of claim 1, wherein the hearing aid is a behind-the-ear hearing aid.

6. A hearing aid for correcting a hearing impairment of a user, comprising:
    an input signal channel having a microphone and providing digital input signals;
    a plurality of cascaded all-pass filters, wherein said digital input signals pass through said plurality of cascaded all-pass filters, and wherein said plurality of cascaded all-pass filters output a sequence of delayed samples;
    means for applying a frequency domain transform on said sequence of delayed samples, wherein a warped sequence results from said frequency domain transform applying means;
    means for calculating a plurality of frequency domain level estimates from said warped sequence;
    means for calculating a plurality of frequency domain gain coefficients from said plurality of frequency domain level estimates;
    means for calculating a plurality of spectral enhancement gain coefficients from said warped sequence;
    means for calculating a plurality of compression-spectral enhancement gain coefficients from said plurality of frequency domain gain coefficients and said plurality of spectral enhancement gain coefficients; means for applying an inverse frequency domain transform on said plurality of compression-spectral enhancement gain coefficients, wherein a set of time-domain filter coefficients of a compression gain filter result from said inverse frequency domain transform applying means;
    means for convolving said sequence of delayed samples with said set of time-domain filter coefficients to produce a digital output signal; and
    an output conversion means adapted to convert said digital output signal to an audio output.

7. A hearing aid for correcting a hearing impairment of a user, comprising:
- an input signal channel having a microphone and providing digital input signals;
- an input buffer, said input data buffer holding at least one block of data comprised of a portion of said digital input signals;
- a plurality of cascaded all-pass filters, wherein a first block of said digital input signals pass from said input data buffer through said plurality of cascaded all-pass filters, and wherein said plurality of cascaded all-pass filters output a first sequence of delayed samples;
- means for windowing a first portion of said first sequence of delayed samples, wherein a first windowed sequence of delayed samples results from said windowing means;
- means for applying a first frequency domain transform on said first windowed sequence of delayed samples, wherein a first warped sequence results from said first frequency domain transform applying means;
- means for calculating a first plurality of frequency domain level estimates of said first warped sequence;
- means for calculating a first plurality of spectral enhancement gain coefficients from said first warped sequence;
- means for windowing a second portion of said first sequence of delayed samples, wherein a second windowed sequence of delayed samples results from said windowing means;
- means for applying a second frequency domain transform on said second windowed sequence of delayed samples, wherein a second warped sequence results from said second frequency domain transform applying means;
- means for calculating a second plurality of frequency domain level estimates of said second warped sequence;
- means for calculating a first plurality of spectral enhancement gain coefficients from said first warped sequence;
- means for summing said first and second plurality of spectral enhancement gain coefficients, wherein a summed first and second plurality of spectral enhancement gain coefficients results from said summing means;
- means for summing said first and second plurality of frequency domain level estimates, wherein a summed first and second plurality of frequency domain level estimates results from said summing means;
- means for normalizing said summed first and second plurality of frequency domain level estimates, wherein a normalized first and second plurality of frequency domain level estimates results from said normalizing means;
- means for calculating a plurality of frequency domain gain coefficients from said normalized first and second plurality of frequency domain level estimates;
- means for calculating a plurality of compression-spectral enhancement gain coefficients from said plurality of frequency domain gain coefficients and summed first and second plurality of spectral enhancement gain coefficients;
- means for applying an inverse frequency domain transform on said plurality of compression-spectral enhancement gain coefficients, wherein a set of time-domain filter coefficients of a compression gain filter result from said inverse frequency domain transform applying means;
- means for convolving a second sequence of delayed samples with said time-domain filter coefficients, said second sequence of delayed samples produced by a second block of said digital input signals passing from said input data buffer through said plurality of cascaded all-pass filters, wherein a digital output signal results from said convolving means; and
- an output conversion means for adapted to convert said digital output signal to an audio output.

8. A hearing aid for correcting a hearing impairment of a user, comprising:
- an input signal channel having a microphone and providing digital input signals;
- an input data buffer, said input data buffer holding a block of data of size M comprised of a portion of said digital input signals;
- a plurality of cascaded all-pass filters comprised of 2M cascaded all-pass filters, wherein a first block of said digital input signals pass from said input data buffer through said plurality of cascaded all-pass filters to form a first sequence of delayed samples and wherein a second block of said digital input signals pass from said input data buffer through said plurality cascaded all-pass filters to form a second sequence of delayed samples, and wherein said first sequence of delayed samples and said second sequence of delayed samples form a combined sequence of delayed samples;
- means for windowing a first portion of said combined sequence of delayed samples, wherein said first portion is of size M, wherein a windowed sequence of delayed samples results from said windowing means;
- means for applying a 2M-point frequency domain transform on said windowed sequence of delayed samples, wherein a warped sequence results from said frequency domain transform applying means;
- means for calculating a plurality of frequency domain level estimates of said warped sequence;
- means for calculating a plurality of frequency domain gain coefficients from said plurality of frequency domain level estimates;
- means for calculating a plurality of spectral enhancement gain coefficients from said warped sequence;
- means for calculating a plurality of compression-spectral enhancement gain coefficients from said plurality of frequency domain gain coefficients and said plurality of spectral enhancement gain coefficients;
- means for applying an inverse frequency domain transform on said plurality of compression-spectral enhancement gain coefficients, wherein a set of time-domain filter coefficients of a compression gain filter result from said inverse frequency domain transform applying means; and
- means for convolving a second portion of said combined sequence of delayed samples with said set of time-domain filter coefficients, wherein said second portion is of size M, wherein a digital output signal results from said convolving means; and
- an output conversion means adapted to convert said digital output signal to an audio output.

9. The frequency-warped processing system of claim 6, said means for calculating said plurality of spectral enhancement gain coefficients further comprising a spectral enhancement algorithm, wherein said spectral enhancement algorithm raises a power spectrum comprised of said plurality of frequency domain level estimates to a power greater than 1.

10. The frequency-warped processing system of claim 6, said means for calculating said plurality of spectral enhancement gain coefficients further comprising a spectral enhancement algorithm, wherein said spectral enhancement algorithm amplifies a plurality of peaks of said warped sequence.

11. The frequency-warped processing system of claim 10, wherein said spectral enhancement algorithm further comprises means for identifying said plurality of peaks, said identifying means including means for applying a second-difference operator to said warped sequence.

12. The frequency-warped processing system of claim 6, further comprising a hearing aid, wherein the frequency-warped processing system is incorporated within said hearing aid.

13. The frequency-warped processing system of claim 6, wherein said plurality of frequency domain gain coefficients comprise a warped time-domain filter.

14. The frequency-warped processing system of claim 6, further comprising means for windowing said sequence of delayed samples, wherein a windowed sequence of delayed samples results from said windowing means, and wherein said warped sequence results from applying said frequency domain transform to said windowed sequence of delayed samples.

15. The frequency-warped processing system of claim 6, further comprising a digital-to-analog converter, said digital-to-analog converter converting said digital output signals to analog output signals.

16. The frequency-warped processing system of claim 15, further comprising an output transducer, said output 1 converting said analog output signals to an audio output.

17. The frequency-warped processing system of claim 6, said plurality of cascaded all-pass filters comprising a plurality of first order all-pass filters.

18. The frequency-warped processing system of claim 6, said sequence of delayed samples comprising 16 samples.

19. The frequency-warped processing system of claim 6, further comprising a digital processor, wherein said digital processor is adapted o provide said frequency domain transform applying means, said frequency domain level estimates calculating means, said frequency domain gain coefficients calculating means, said spectral enhancement gain coefficients calculating means, said inverse frequency domain transform applying means, and said means for convolving said sequence of delayed samples.

20. The frequency-warped processing system of claim 19, wherein said digital processor comprises a software programmable digital signal processor.

21. The frequency-warped processing system of claim 6, wherein said frequency domain transform applying means uses a transform selected from the group consisting of discrete Fourier transforms, fast Fourier transforms, Goertzel transforms, and discrete cosine transforms.

22. The frequency-warped processing system of claim 6, further comprising:
an input transducer, said input transducer converting audio input signals to analog input signals; and
an analog-to-digital converter, said analog-to-digital converter converting said analog input signals to said digital input signals.

23. The frequency-warped processing system of claim 6, further comprising:
a digital-to-analog converter, said digital-to-analog converter converting said digital output signals to analog output signals; and an output transducer, said output transducer converting said analog output signals to an audio output.

24. The frequency-warped processing system of claim 7, said means for calculating said first and second plurality of spectral enhancement gain coefficients further comprising a spectral enhancement algorithm, wherein said spectral enhancement algorithm raises a power spectrum comprised of said plurality of frequency domain level estimates to a power greater than 1.

25. The frequency-warped processing system of claim 7, said means for calculating said first and second plurality of spectral enhancement gain coefficients further comprising a spectral enhancement algorithm, wherein said spectral enhancement algorithm amplifies a plurality of peaks of said warped sequence.

26. The frequency-warped processing system of claim 25, wherein said spectral enhancement algorithm further comprises means for identifying said plurality of peaks, said identifying means including means for applying a second-difference operator to said warped sequence.

27. The frequency-warped processing system of claim 7, said means for calculating said first and second plurality of spectral enhancement gain coefficients further comprising a spectral enhancement algorithm, wherein said spectral enhancement algorithm includes means for forming an unsmeared warped sequence, and means for calculating the difference between said warped sequence and said unsmeared warped sequence.

28. The frequency-warped processing system of claim 7, further comprising a hearing aid, wherein the frequency-warped processing system is incorporated within said hearing aid.

29. The frequency-warped processing system of claim 7, wherein said plurality of frequency domain gain coefficients comprise a warped time-domain filter.

30. The frequency-warped processing system of claim 7, further comprising a digital-to-analog converter, said digital-to-analog converter converting said digital output signals to analog output signals.

31. The frequency-warped processing system of claim 30, further comprising an output transducer, said output transducer converting said analog output signals to an audio output.

32. The frequency-warped processing system of claim 7, said plurality of cascaded all-pass filters comprising a plurality of first order all-pass filters.

33. The frequency-warped processing system of claim 7, further comprising a digital processor, wherein said digital processor is adapted to provide said windowing means, said means for applying said first and second frequency domain transforms, said means for calculating said first and second plurality of frequency domain level estimates, said summing means, said normalizing means, said frequency domain gain coefficients calculating means, said inverse frequency domain transform applying means, and said convolving means.

34. The frequency-warped processing system of claim 7, wherein said means for applying said first and second frequency domain transforms use a transform selected from the group consisting of discrete Fourier transforms, fast Fourier transforms, Goertzel transforms, and discrete cosine transforms.

35. The frequency-warped processing system of claim 7, further comprising:
an input transducer, said input transducer converting audio input signals to analog input signals; and
an analog-to-digital converter, said analog-to-digital converter converting said analog input signals to said digital input signals.

36. The frequency-warped processing system of claim 7, further comprising:
- a digital-to-analog converter, said digital-to-analog converter converting said digital output signals to analog output signals; and
- an output transducer, said output transducer converting said analog output signals to an audio output.

37. The frequency-warped processing system of claim 7, wherein said windowing means provides a 50 percent overlap of said first and second pluralities of frequency domain level estimates.

38. The frequency-warped processing system of claim 7, wherein a quantity of samples corresponding to said first block of said digital input signals is equivalent to a quantity of first order all-pass filters corresponding to said plurality of cascaded all-pass filters.

39. The frequency-warped processing system of claim 38, wherein said first portion of said first sequence of delayed samples is comprised of a first half of said first sequence of delayed samples and said second portion of said first sequence of delayed samples is comprised of a second half of said first sequence of delayed samples.

40. The frequency-warped processing system of claim 8, said means for calculating said plurality of spectral enhancement gain coefficients further comprising a spectral enhancement algorithm, wherein said spectral enhancement algorithm raises a power spectrum comprised of said plurality of frequency domain level estimates to a power greater than 1.

41. The frequency-warped processing system of claim 8, said means for calculating said plurality of spectral enhancement gain coefficients further comprising a spectral enhancement algorithm, wherein said spectral enhancement algorithm amplifies a plurality of peaks of said warped sequence.

42. The frequency-warped processing system of claim 41, wherein said spectral enhancement algorithm further comprises means for identifying said plurality of peaks, said identifying means for including means for applying a second difference operator to said warped sequence.

43. The frequency-warped processing system of claim 8, said means for calculating said plurality of spectral enhancement gain coefficients further comprising a spectral enhancement algorithm, wherein said spectral enhancement algorithm includes means for forming an unsmeared warped sequence, and means for calculating the difference between said warped sequence and said unsmeared warped sequence.

44. The frequency-warped processing system of claim 8, further comprising a hearing aid, wherein the frequency-warped processing system is incorporated within said hearing aid.

45. The frequency-warped processing system of claim 8, wherein said plurality of frequency domain gain coefficients comprise a warped time-domain filter.

46. The frequency-warped processing system of claim 8, further comprising a digital-to-analog converter, said digital-to-analog converter converting said digital output signals to analog output signals.

47. The frequency-warped processing system of claim 46, further comprising an output transducer, said output transducer converting said analog output signals to an audio output.

48. The frequency-warped processing system of claim 8, said plurality of cascaded all-pass filters comprising a plurality of first order all-pass filters.

49. The frequency-warped processing system of claim 8, further comprising a digital processor, wherein said digital processor is adapted to provide said windowing means, said means for applying said 2M-point frequency domain transform, said means for calculating said plurality of frequency domain level estimates, said frequency domain gain coefficients calculating means, said inverse frequency domain transform applying means, and said convolving means.

50. The frequency-warped processing system of claim 8, wherein said means for applying said frequency domain transform uses a transform selected from the group consisting of discrete Fourier transforms, fast Fourier transforms, Goertzel transforms, and discrete cosine transforms.

51. The frequency-warped processing system of claim 8, further comprising:
- an input transducer, said input transducer converting audio input signals to analog input signals; and
- an analog-to-digital converter, said analog-to-digital converter converting said analog input signals to said digital input signals.

52. The frequency-warped processing system of claim 8, further comprising: a digital-to-analog converter, said digital-to-analog converter converting said digital output signals to analog output signals; and an output transducer, said output transducer converting said analog output signals to an audio output.

53. The frequency-warped processing system of claim 6, said means for calculating said plurality of spectral enhancement gain coefficients further comprising a spectral enhancement algorithm, wherein said spectral enhancement algorithm includes means for forming an unsmeared warped sequence, and means for calculating the difference between said warped sequence and said unsmeared warped sequence.

* * * * *

UNITED STATES PATENT AND TRADEMARK OFFICE
CERTIFICATE OF CORRECTION

PATENT NO.    : 6,980,665 B2
DATED         : December 27, 2005
INVENTOR(S)   : James M. Kates It is certified that error appears in the above-identified patent and that said Letters Patent is hereby corrected as shown below:

Column 1,
Line 19, replace "dependent" with -- depends --.

Column 7,
Line 16, insert -- filter -- between "FIR" and "having".

Column 12,
Line 26, delete "the" between "for" and "raising".

Column 13,
Line 3, delete "the" between "for" and "raising".

Column 16,
Line 10, delete "for" between "means" and "adapted".
Line 26, replace "plurality cascaded" with -- plurality of cascaded --.
Line 64, replace "frequency-warped processing system" with -- hearing aid --.

Column 17,
Lines 4, 9, 14, 18, 21, 27, 31, 34, 37, 39, 48, 51, 56 and 63, replace "frequency-warped processing system" with -- hearing aid --.
Line 32, delete "1" between "output" and "converting".
Line 41, replace "o" with -- to --.

Column 18,
Lines 3, 9, 15, 20, 27, 31, 34, 38, 42, 45, 55 and 61, replace "frequency-warped processing system" with -- hearing aid --.

Column 19,
Lines 1, 8, 12, 17, 23, 30, 36 and 41, replace "frequency-warped processing system" with -- hearing aid --.

UNITED STATES PATENT AND TRADEMARK OFFICE
CERTIFICATE OF CORRECTION

PATENT NO. : 6,980,665 B2
DATED : December 27, 2005
INVENTOR(S) : James M. Kates It is certified that error appears in the above-identified patent and that said Letters Patent is hereby corrected as shown below:

<u>Column 20,</u>
Lines 1, 4, 8, 12, 15, 25, 30, 37 and 43, replace "frequency-warped processing system" with -- hearing aid --.

Signed and Sealed this

Fourth Day of April, 2006

JON W. DUDAS
*Director of the United States Patent and Trademark Office*